(12) United States Patent
Nakamura

(10) Patent No.: US 9,030,812 B2
(45) Date of Patent: May 12, 2015

(54) JOINING STRUCTURE OF MULTI-SEGMENT HOUSING AND ELECTRONIC DEVICE PROVIDED WITH THAT JOINING STRUCTURE

(71) Applicant: Fujitsu Limited, Kawasaki-shi, Kanagawa (JP)

(72) Inventor: Yutaka Nakamura, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/315,534

(22) Filed: Jun. 26, 2014

(65) Prior Publication Data

US 2014/0306864 A1    Oct. 16, 2014

Related U.S. Application Data

(63) Continuation of application No. PCT/JP2012/083989, filed on Dec. 27, 2012.

(30) Foreign Application Priority Data

Dec. 28, 2011 (JP) ................................. 2011-289410

(51) Int. Cl.
| | |
|---|---|
| *H05K 5/00* | (2006.01) |
| *H05K 7/00* | (2006.01) |
| *G06F 1/16* | (2006.01) |
| *G09G 5/00* | (2006.01) |
| *H05K 7/16* | (2006.01) |
| *E05D 3/12* | (2006.01) |
| *G06F 3/14* | (2006.01) |
| *H04M 1/02* | (2006.01) |
| *E05D 15/58* | (2006.01) |

(52) U.S. Cl.
CPC .............. *H05K 7/16* (2013.01); *Y10T 16/5475* (2015.01); *G06F 1/1624* (2013.01);

(Continued)

(58) Field of Classification Search
CPC ..... G06F 1/1641; G06F 1/1647; G06F 1/1679; G06F 3/1423; H04M 2250/16; H04M 1/0239
USPC ............ 361/679.01, 679.04, 679.21; 345/1.1, 345/1.3
See application file for complete search history.

(56) References Cited

U.S. PATENT DOCUMENTS

| | | | | |
|---|---|---|---|---|
| 6,016,176 A | * | 1/2000 | Kim et al. ...................... | 349/84 |
| 6,577,496 B1 | * | 6/2003 | Gioscia et al. ............. | 361/679.3 |

(Continued)

FOREIGN PATENT DOCUMENTS

| | | |
|---|---|---|
| JP | 4-44154 | 2/1992 |
| JP | 2009-71588 | 4/2009 |

(Continued)

OTHER PUBLICATIONS

International Search Report of PCT/JP2012/083989 mailed Apr. 2, 2013.

*Primary Examiner* — Anthony Haughton
(74) *Attorney, Agent, or Firm* — Staas & Halsey LLP

(57) ABSTRACT

A joining structure of superposed first to fourth segment housing of an electronic device each having a display screen equipped with two shafts arranged between first and second housing segments and third and fourth housing segments, a first hinge which joins end faces of the second and third housing segments to be able to rotate and a second hinge which joins opposite side end faces of the first and fourth housing segments, two shafts make the second and third housing segments slide with respect to the first and fourth housing segments, then make one rotate 180 degrees with respect to the other in the finished slid state, by using the first and second hinges to make the second and third housing segments and the first and fourth housing segments rotate about the shafts, and superposed first to fourth segment housing are opened to form a single flat display surface.

19 Claims, 14 Drawing Sheets

(52) U.S. Cl.
CPC ......... *H04M 1/0216* (2013.01); *H04M 1/0237* (2013.01); *G06F 1/1616* (2013.01); *G06F 1/1641* (2013.01); *E05D 3/12* (2013.01); *G06F 3/1446* (2013.01); *H04M 1/0247* (2013.01); *E05Y 2900/606* (2013.01); *E05D 15/581* (2013.01)

(56) References Cited

U.S. PATENT DOCUMENTS

| | | | |
|---|---|---|---|
| 6,643,124 B1* | 11/2003 | Wilk | 361/679.04 |
| 7,095,387 B2* | 8/2006 | Lee et al. | 345/4 |
| 7,180,665 B2* | 2/2007 | Daniel et al. | 359/461 |
| 7,187,363 B2* | 3/2007 | Nguyen et al. | 345/168 |
| 7,782,274 B2* | 8/2010 | Manning | 345/1.3 |
| 7,965,835 B2* | 6/2011 | Park et al. | 379/433.13 |
| 8,380,327 B2* | 2/2013 | Park | 700/1 |
| 8,605,421 B2* | 12/2013 | Verschoor et al. | 361/679.3 |
| 8,863,038 B2* | 10/2014 | King et al. | 715/863 |
| 2001/0003450 A1* | 6/2001 | Hemia et al. | 345/170 |
| 2006/0061555 A1* | 3/2006 | Mullen | 345/169 |
| 2010/0188350 A1 | 7/2010 | Sawada | |

FOREIGN PATENT DOCUMENTS

| | | |
|---|---|---|
| JP | 2010-154149 | 7/2010 |
| JP | 2010-266752 | 11/2010 |

\* cited by examiner

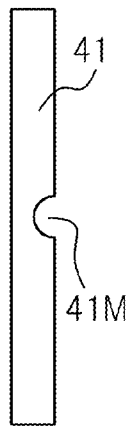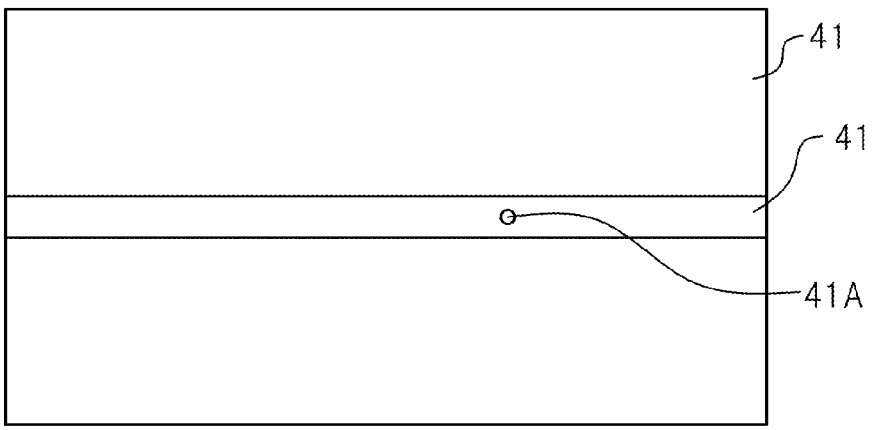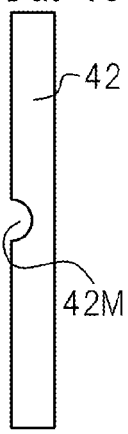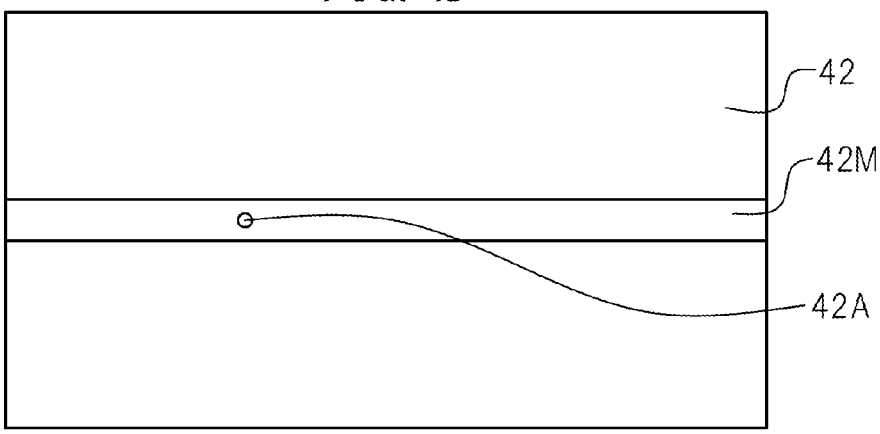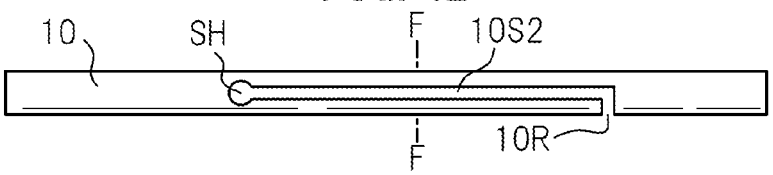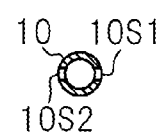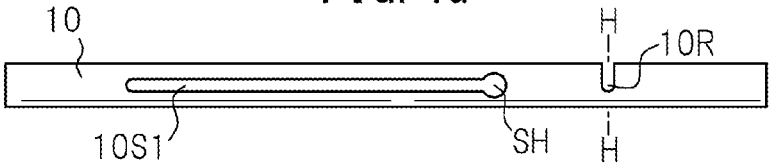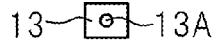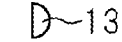

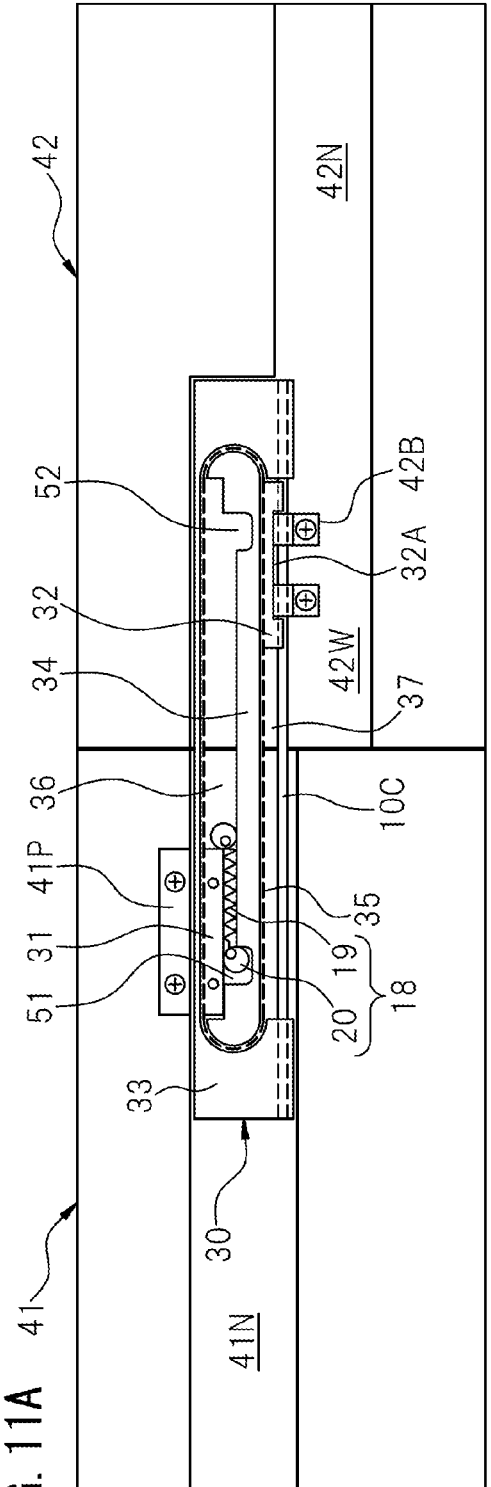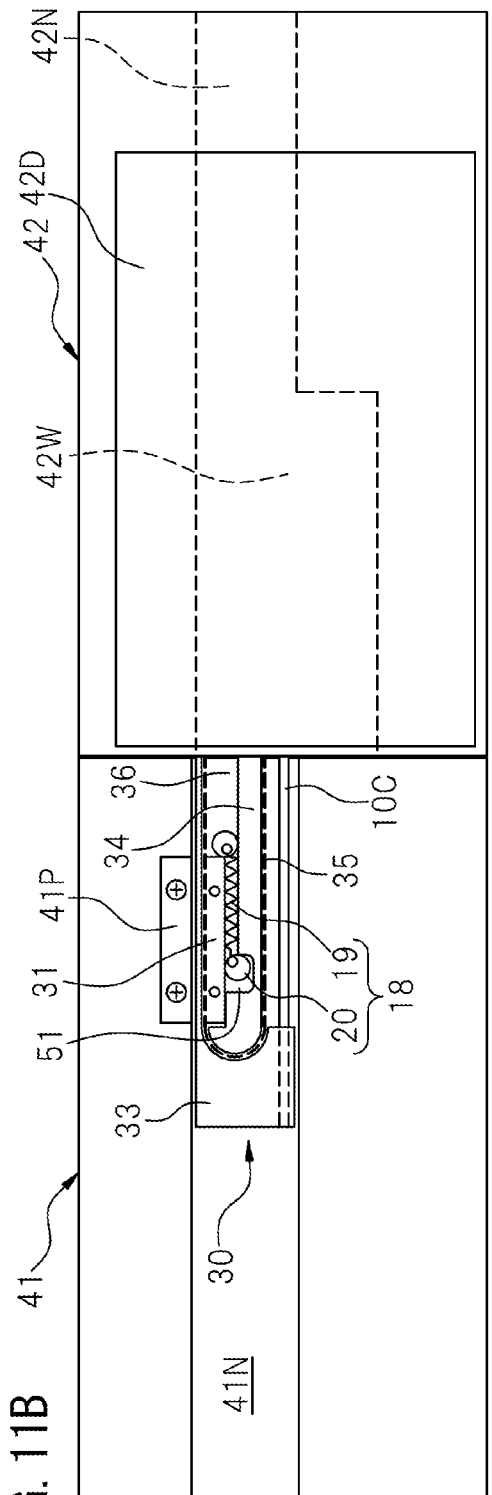

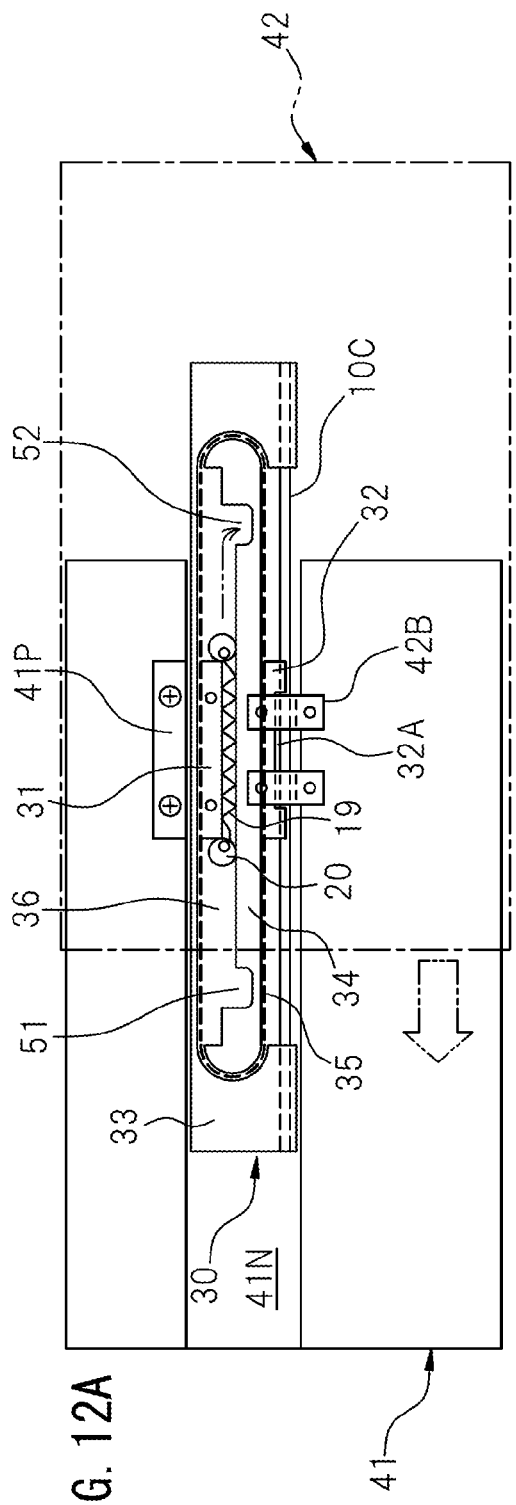
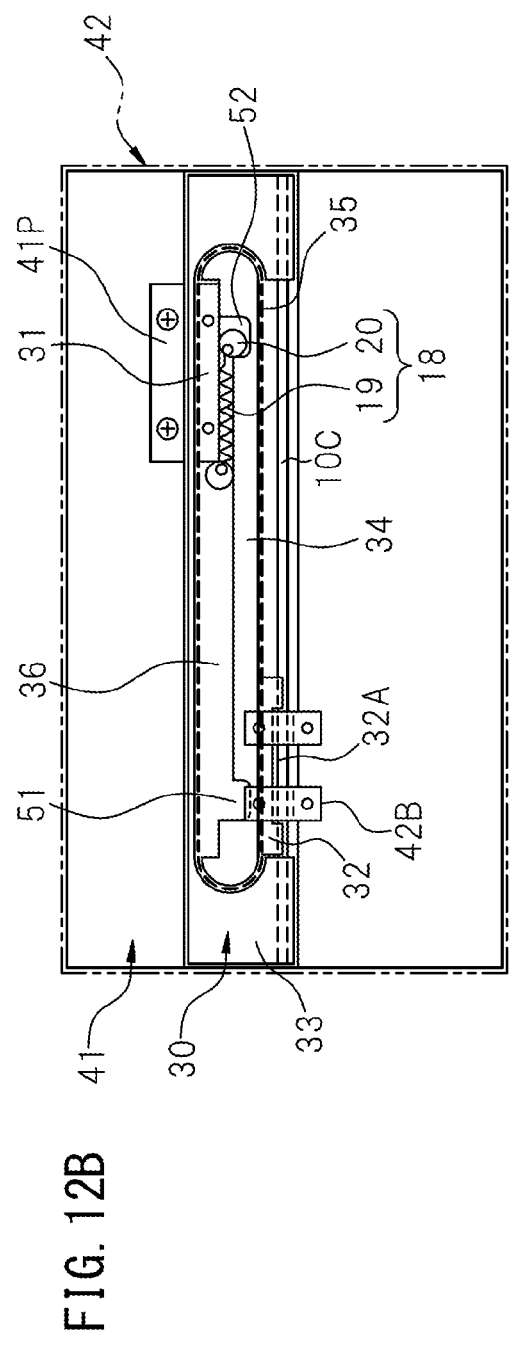
FIG. 12A
FIG. 12B

JOINING STRUCTURE OF MULTI-SEGMENT HOUSING AND ELECTRONIC DEVICE PROVIDED WITH THAT JOINING STRUCTURE

CROSS-REFERENCE TO RELATED APPLICATION

This application is a continuation application based upon and claiming priority of PCT Application No. PCT/JP2012/083989, filed on Dec. 27, 2012, the contents being incorporated herein by reference. The International Application claims the benefit of Japanese Patent Application No. 2011-289410, filed on Dec. 28, 2011, the entire contents of which are incorporated herein by reference.

FIELD

The present application relates to a joining structure of a multi-segment housing and an electronic device which is provided with that joining structure.

BACKGROUND

In recent years, the smaller size and increased thinness of mobile phones and other information terminals have led to improvement of their portability and operability. To facilitate viewing of the display, there are products where the display parts and other movable parts are made to slide with respect to the keyboard and other fixed parts. FIG. 1A illustrates an information terminal 3 in the state where a fixed housing (lower housing) 1 has a movable housing (upper housing) 2 laid over it. This information terminal 3, as illustrated in FIG. 1B, is used in a state with the movable housing 2 made to slide with respect to the fixed housing 1. As such a type of information terminal 3, for example, there are mobile phones, handheld terminals (tablet computers and other small-sized computers), game machines, etc.

In this regard, in such an information terminal 3, as illustrated in FIG. 1B, when the movable housing 2 is made to slide with respect to the fixed housing 1, due to the structure of the housing, it is necessary that in the state where the fixed housing 1 and the movable housing 2 are opened up wide (fully slid state), there be a part L where the two are superposed. For this reason, the amount of slide of the movable housing 2 with respect to the fixed housing 1 was up to about two-thirds of the housing length in the slid direction. This structure was good in the case of making the lower fixed housing 1 the keyboard, but when the lower fixed housing 1 is a display part, since there is an overlap part L, a sufficient display area could not be obtained.

As opposed to this, an information terminal 4 of a structure where the movable housing 2 becomes flat with respect to the fixed housing 1 (fully flat) at the time of full sliding such as illustrated in FIG. 1C is, for example, disclosed in Japanese Laid Open Patent Publication No. 2009-71588 and Japanese Laid Open Patent Publication No. 2010-154149. In Japanese Laid Open Patent Publication No. 2009-71588, there are coupling pieces which couple the side surfaces of the fixed housing (first housing) and movable housing (second housing). One of two pins at the coupling pieces is supported at the movable housing in a rotatable state, while the other is engaged with the fixed housing in a slidable state. Further, in Japanese Laid Open Patent Publication No. 2010-154149, a fixed housing (second housing) and a movable housing (first housing) are connected by a link mechanism. The movable housing is slid full from the fixed housing segment resulting in a fully flat display screen.

When using a handheld terminal for applications such as e-mail or Twitter, a small size such as that of a smartphone is good, but when viewing a magazine or newspaper in the form of an electronic book, a large screen tablet is suitable. Further, carrying around both a smartphone type mobile phone and tablet is troublesome, so there is a need for using a tablet for both applications.

SUMMARY

However, while there have been terminals with two screens made into a single flat screen, there has never been a terminal where a greater number of screens, or example, four screens of mobile phone sizes, are joined to realize a size equal to that of a tablet. Further, while it had been possible to join four housing segments to form a multi-screen information terminal, there was the problem that, as illustrated in FIG. 1D, step differences formed at the four housing segments 5A to 5D which form the information terminal 5. Further, if step differences form, the screen becomes difficult to view and the touch operation (wipe operation) ends up being hindered.

In the present application, there is provided a joining structure of a multi-segment housing in an electronic device which joins a large number of housing segments to form a single screen wherein when joining the housing segments, the screen of the joined housing segments becomes fully flat. Further, there is provided an electronic device which is provided with a joining structure of a multi-segment housing wherein when joining the housing segments, the screen of the joined housing segments becomes fully flat.

According to one aspect of the embodiment, there is provided a joining structure of a multi-segment housing characterized by being provided with shafts which are arranged between first and second housing segments and third and fourth housing segments when superposing first to fourth four housing segments in that order and each of which makes superposed housing segments slide, then makes one rotate 180 degrees with respect to the other, a first hinge which joins single end faces of the second and third housing segments which are exposed in directions parallel with the shaft, and a second hinge which joins end faces of the first and fourth housing segments which are exposed in directions parallel with the shaft at opposite sides to the end faces of the first hinge sides, the shafts being used to make the second and third housing segments slide with respect to the first and fourth housing segments and, in the finished slid state, the first and second hinges being used to make the second and third housing segments and the first and fourth housing segments rotate about the shafts and open to form a single flat surface.

BRIEF DESCRIPTION OF DRAWINGS

FIG. 4A is a front view of one embodiment of a first housing segment.

FIG. 4B is a right side view of the first housing segment which is illustrated in FIG. 4A.

FIG. 4C is a front view of one embodiment of a second housing segment.

FIG. 4D is a right side view of the second housing segment which is illustrated in FIG. 4C.

FIG. 4E is a plan view of one embodiment of a shaft of a joining structure which is built in between first and second housing segments.

FIG. 4F is a cross-sectional view along a line F-F of FIG. 4E.

FIG. 4G is a bottom view of the shaft which is illustrated in FIG. 4E.

FIG. 4I is a plan view of a slide assist member which is inserted in the shaft which is illustrated in FIG. 4E and FIG. 4G.

FIG. 4H is a cross-sectional view along a line H-H of FIG. 4G.

FIG. 4J is a cross-sectional view of the slide assist member which is illustrated in FIG. 4I.

FIG. 4F is attached to the first and second housing segments through slide assist members.

FIG. 11A is a side view which illustrates the first and second housing segments to which a joining structure of a multi-segment housing which is provided with slide assist mechanisms which is illustrated in FIG. 10 is attached and illustrates the state of completion of the sliding and rotating of the second housing segment with respect to the first housing segment.

FIG. 11B is a side view which illustrates the state of the second housing segment rotating with respect to the first housing segment about a shaft by 180 degrees from the state of FIG. 11A.

FIG. 12A is a side view which illustrates the operation of a joining structure of a multi-segment housing which is provided with slide assist mechanisms at the time when the second housing segment slides in a direction which approaches the first housing segment from the state of FIG. 11B.

FIG. 12B is a side view which illustrates the operation of a joining structure of a multi-segment housing which is provided with slide assist mechanisms when the second housing segment of FIG. 12A is slid further with respect to the first housing segment and the two housing segments are superposed.

DESCRIPTION OF EMBODIMENTS

Below, embodiments of the present application will be explained in detail based on specific examples.

Figure 1A:
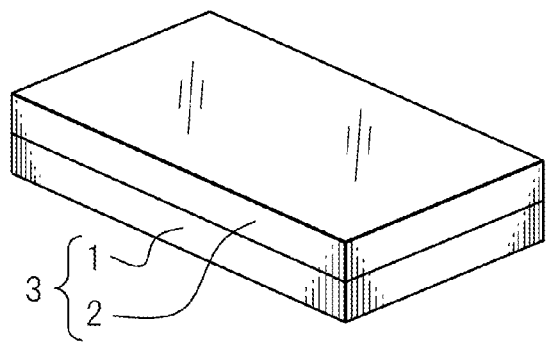
FIG. 1A is a perspective view which illustrates a closed state of a slide-type information terminal of the related art.
Figure 1B:
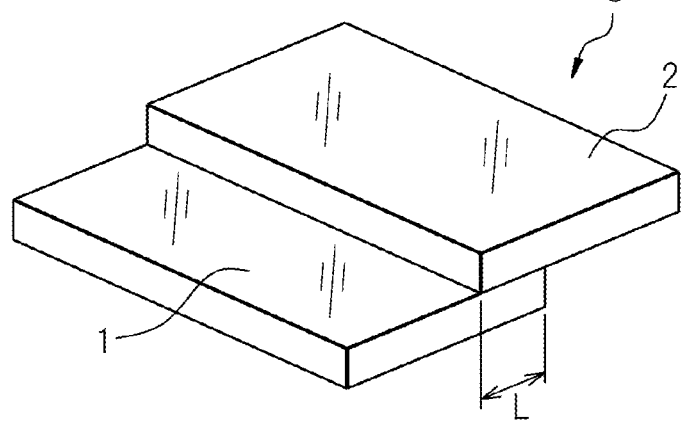
FIG. 1B is a perspective view which illustrates a sliding state of the information terminal which is illustrated in FIG. 1A.
Figure 1C:
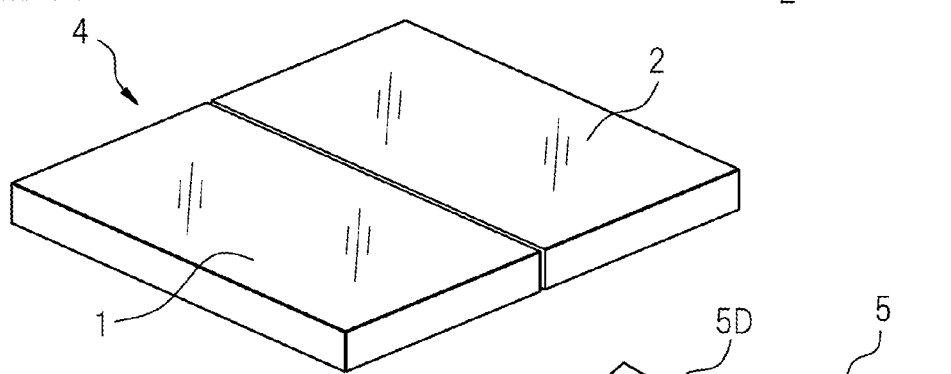
FIG. 1C is a perspective view which illustrates a fully flat state of a screen obtained by further sliding of the information terminal which is illustrated in FIG. 1B.
Figure 1D:
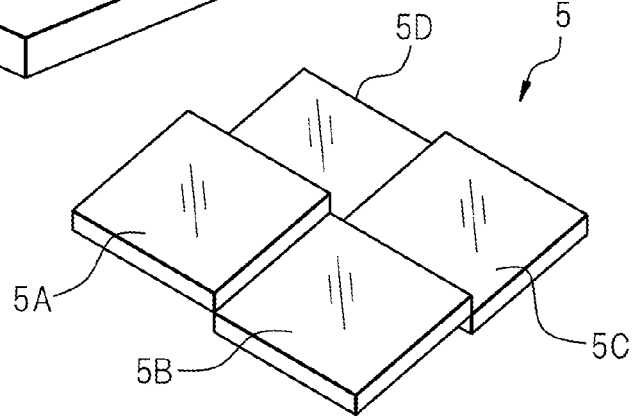
FIG. 1D is a perspective view which illustrates an information terminal of the related art which is provided with a combined screen obtained by joining four housing segments.
Figure 2A:
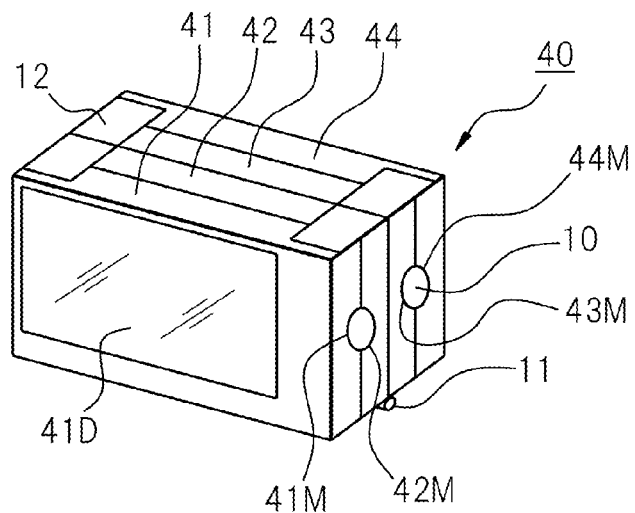
FIG. 2A is a perspective view which illustrates a closed state of a screen of one embodiment of an electronic device which is provided with a multi-segment housing.
Figure 2B:
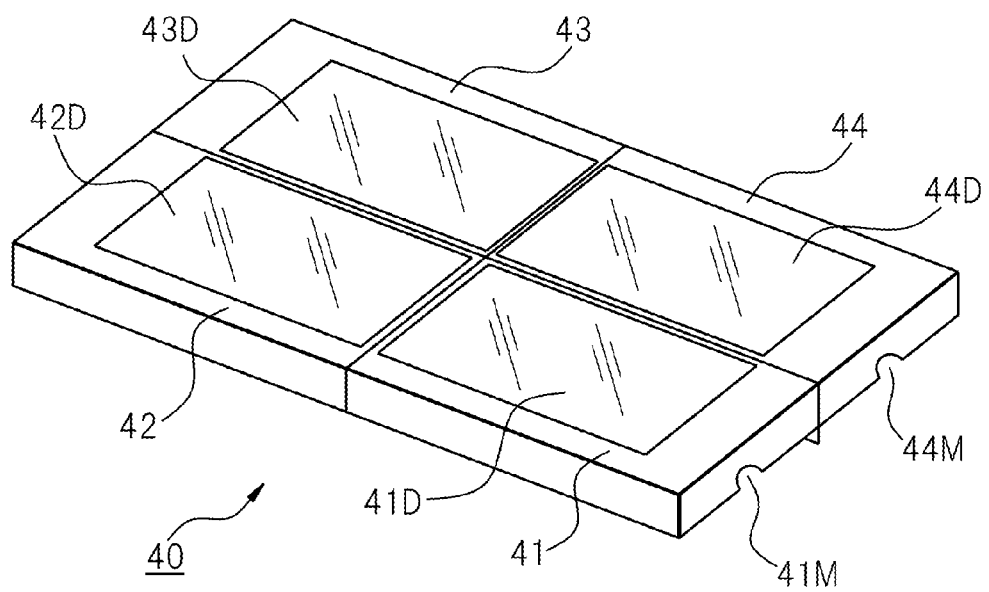
FIG. 2B is a perspective view which illustrates the state of using a joining structure to open the multi-segment housing of the electronic device which is illustrated in FIG. 2A and of formation of a single screen on a flat surface.

FIG. 2A illustrates a closed state of one embodiment of an electronic device 40 which is provided with a multi-segment housing, while FIG. 2B illustrates an electronic device 40 in a state opened using a later explained joining structure. The electronic device 40 of this embodiment is provided with first to fourth four housing segment parts 41 to 44. The housing segment parts 41 to 44 will be referred to as simply the "housing segments 41 to 44" hereinafter. The first to fourth four housing segments 41 to 44 respectively have screens (displays) 41D to 44D. In the state where the first to fourth four housing segments 41 to 44 are opened up, the displays 41D to 44D adjoin each other and form a single large screen. If providing each of the first to fourth housing segments 41 to 44 with a control device for displaying an image of a screen of one-fourth of one displayed image synchronized with the other screens, it is possible to display a large image on a single large screen.

As illustrated in FIG. 2A, in the first to fourth four housing segments 41 to 44, the first and second housing segments 41 and 42 are paired and the third and fourth housing segments 43 and 44 are paired. The superposed surfaces of the first and second housing segments 41 and 4 have circumferential grooves 41M and 42M. In the circumferential grooves 41M and 42M, a shaft 10 is housed. In the same way, the superposed surfaces of the third and fourth housing segments 43 and 44 have circumferential grooves 43M and 44M. In the circumferential grooves 43M and 44M, a shaft 10 is housed.

In the electronic device 40, the second housing segment 42 and the third housing segment 43 are arranged adjoining each other, aligned end faces of the second housing segment 42 and third housing segment 43 in the long direction (in FIG. 2A, the lower end faces) have first hinges 11 which connect the end faces together (hereinafter simple referred to as the "hinges 11") attached to them. The second housing segment 42 and third housing segment 43 can be opened in a V-shape about the hinges 11 as shafts. Further, the first and fourth housing segments 41 and 44 which are arranged at the outer sides of electronic device 40 have second hinges 12 which connect the end faces together (hereinafter simply referred to as the "hinges 12") at the other end faces in the long direction (in FIG. 2A, the upper end faces) attached to them. The first housing segment 41 and the fourth housing segment 44 can open in a V-shape about the hinges 12 as shafts. These operations will be explained later.

The first and second housing segments 41 and 42 and the third and fourth housing segments 43 and 44 which are illustrated in FIG. 2A are exactly the same in operations using the shafts 10, so here FIG. 3 will be used to explain the operation of the first and second housing segments 41 and 42 in the electronic device 40. FIG. 3A illustrates the state where the first and second housing segments 41 and 42 are superposed and closed. As explained above, the superposed surfaces of the first and second housing segments 41 and 42 hold a shaft 10. The first and second housing segments 41 and 42 can be operated to slide and rotate by the shaft 10.

Figure 3A:
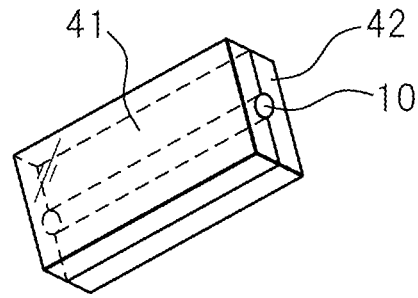
FIG. 3A is a perspective view which illustrates two housing segments of a multi-segment housing of one embodiment in a state superposed and closed.
Figure 3B:
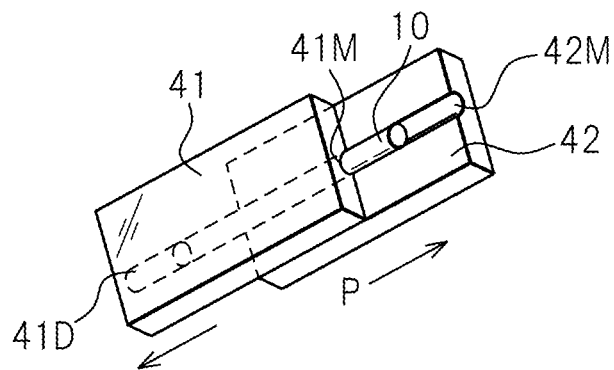
FIG. 3B is a perspective view which illustrates the state of sliding of the two housing segments which are illustrated in FIG. 3A using a shaft of the joining structure.
Figure 3C:
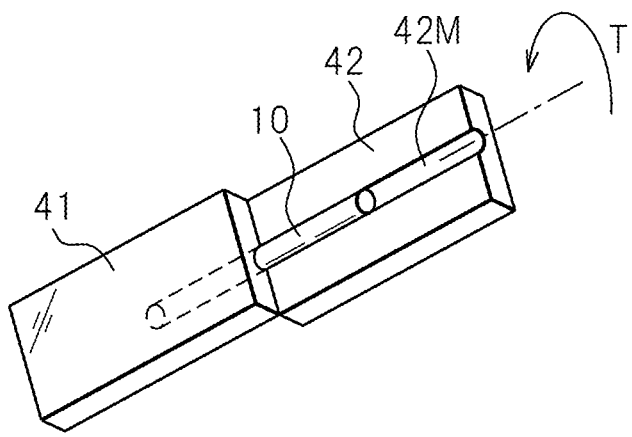
FIG. 3C is a perspective view which illustrates the state of rotation of one of the two housing segments which are illustrated in FIG. 3B by 180 degrees with respect to the other by using the shaft of the joining structure.

FIG. 3B illustrates the state where the second housing segment 42 is slid with respect to the first housing segment 41 which is illustrated in FIG. 3A in a direction P away from it using a shaft 10. Here, the length of the shaft 10 which sticks out from the first housing segment 41 and sticks out into the groove 42M of the second housing segment 42 and the length of the shaft 10 which sticks out from the second housing segment 42 and sticks out into the groove 41M of the first housing segment 41 are the same. FIG. 3C illustrates the state where the first housing segment 41 and the second housing segment 42 which are illustrated in FIG. 3B have slid to the maximum extent (slide end state, hereinafter also referred to as the "fully slid state"). In the fully slid state, the adjoining end parts of the first housing segment 41 and second housing segment 42 are not superposed. The second housing segment 42 can rotate about the shaft 10 as shown by the arrow T with respect to the first housing segment 41 by 180 degrees.

Figure 3D:
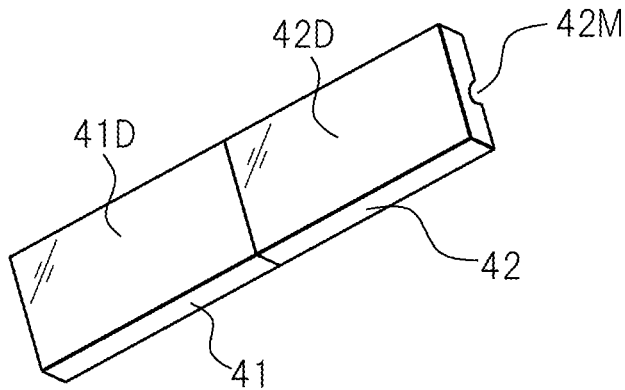
FIG. 3D is a perspective view which illustrates the state of making one housing segment which is illustrated in FIG. 3C rotate by 180 degrees to make the display surfaces of the two housing segments flat.

FIG. 3D illustrates the state where the second housing segment 42 rotates about the shaft 10 with respect to the first housing segment 41 by 180 degrees from the state which is illustrated in FIG. 3C. If the second housing segment 42 rotates about the shaft 10 by 180 degrees, the aligned surfaces of the housing segments of the first and second housing segments 41 and 42 become flat, so if designating these surfaces as the displays 41D and 42D, a flat two-segment screen is obtained. At this time, the side surface of the shaft 10 is exposed at the back surface side of the flat two-segment screen. Note that, the shaft 10 does not have to be a perfect cylindrical shape. It is sufficient that it be a shape where the second housing segment 42 can rotate with respect to the first housing segment 41 by 180 degrees.

Next, FIG. 4 will be used to explain a specific embodiment of the first and second housing segments 41 and 42 and their shaft 10. The structures of the third and fourth housing segments 43 and 44 and their shaft 10 are exactly the same as the structures of the first and second housing segments 41 and 42 and their shaft 10, so their explanations will be omitted. FIG. 4A is a front view of the first housing segment 41, while FIG. 4B is a right side view of the first housing segment 41 which is illustrated in FIG. 4A. The first housing segment 41 is formed with a circumferential groove 41M at the center part in the long direction. Further, at a predetermined position of the circumferential groove 41M, there is a screw hole 41A for attaching a later mentioned slide assist member. FIG. 4C is a front view of the second housing segment 42, while FIG. 4D is a left side view of the second housing segment 42 which is illustrated in FIG. 4C. The second housing segment 42 is formed with a circumferential groove 42M at the center part in the long direction. Further, at a predetermined position of the circumferential groove 42M, there is a screw hole 42A for attaching the later mentioned slide assist member.

FIG. 4E is a plan view of a shaft 10 which is held in the grooves 41M and 42M of superposed surfaces of the first and second housing segments 41 and 42, while FIG. 4F is a cross-sectional view along the line F-F of FIG. 4E. Further, FIG. 4G is a bottom view of the shaft 10 which is illustrated in FIG. 4E, while FIG. 4H is a cross-sectional view along the line H-H of FIG. 4G. The length of the shaft 10 is the same as the lengths of the first and second housing segments 41 and 42 in the long direction. The shaft 10 is a hollow tube shape. As illustrated in FIG. 4F, slits 10S1 and 10S2 are provided at the front side and back side of the wall surface in the long direction. The large diameter holes SH which are provided at first end parts of the slits 10S1 and 10S2 are for insertion of a screw head or for insertion of a screwdriver for turning a screw. At the other end part of the slit 10S2, a ring-shaped slit 10R which extends in the circumferential direction is provided. The ring-shaped slit 10R, as illustrated in FIG. 4H, is provided with a length enough to allow a screw which moved in the slit 10S2 to move 180 degrees to the opposite side.

FIG. 4I is a plan view of a slide assist member 13 which is inserted in the hollow shaft 10 which is illustrated in FIG. 4E to FIG. 4H, while FIG. 4J is a side view of the slide assist member 13 which is illustrated in FIG. 4I. One surface of the slide assist member 13 in the long direction is a flat surface, while the other surface is a circumferential surface mating with the inner circumferential surface of the hollow shaft 10. The slide assist member 13 is provided with a hole 13A which runs from the flat surface to the circumferential surface for insertion of a screw. One of the slide assist members 13 is attached to a screw hole 41A at a predetermined position of the circumferential groove 41M by a screw which is inserted through the slit 10S1 of the shaft 10. Another of the slide assist members 13 is attached to a screw hole 42A at a predetermined position of the circumferential groove 42M by a screw which is inserted through the slit 10S2 of the shaft 10.

Figure 5A:
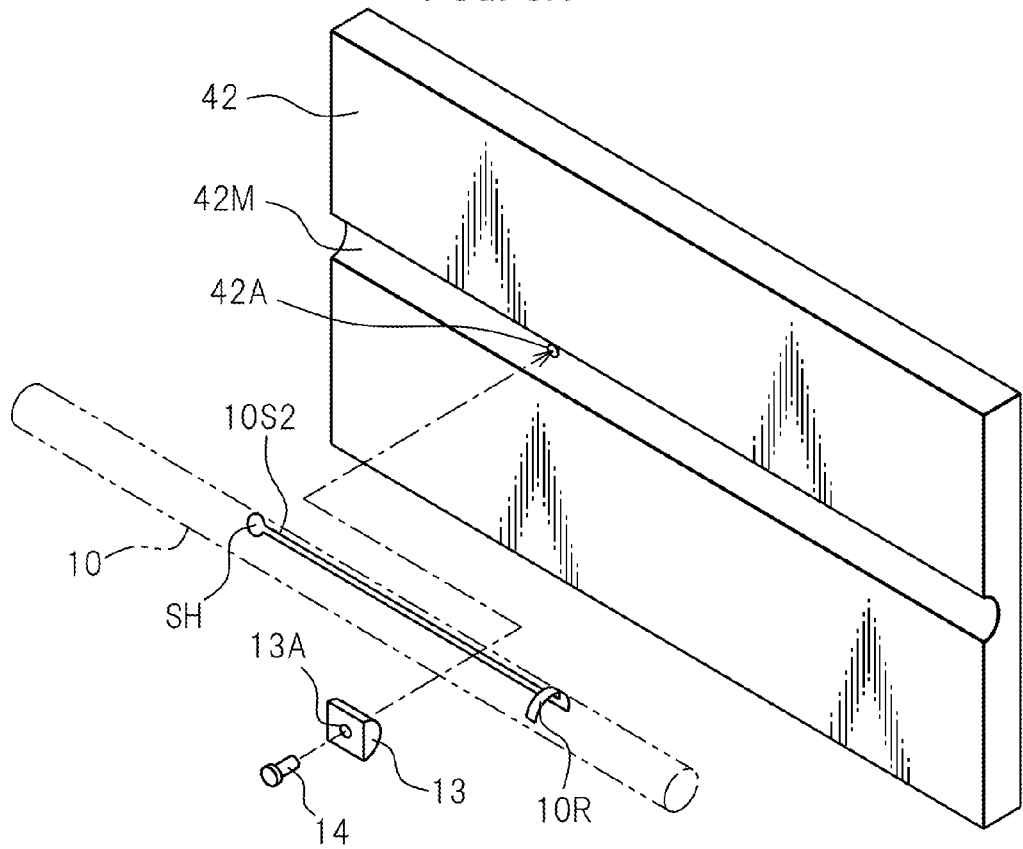
FIG. 5A is an assembled perspective view which illustrates the state of attaching the shaft which is illustrated in FIG. 4E to the second housing segment by using the slide assist member.

FIG. 5A is an assembled perspective view which illustrates the state of attaching the shaft 10 which is illustrated in FIG. 4E to the second housing segment 42 by using a slide assist member 13. The slide assist member 13 is first inserted into the hollow shaft 10, then the screw 14 for attaching the slide assist member 13 to the second housing segment 42 is, for example, passed through the hole SH at the end part of the slit 10S1 which is illustrated in FIG. 4G and inserted in the shaft 10. Further, the screw 14 which is attached to the slide assist member 13 is screwed by a screwdriver which is inserted through the hole SH to the second housing segment 42. If, in this way, the slide assist member 13 is attached by a screw 14 to the second housing segment 42, the second housing segment 42 can move with respect to the shaft 10 in the long direction and can rotate by the slit 10R with respect to the shaft 10 by 180 degrees. The other slide assist member 13 can also be attached to the first housing segment 41 using a screw 14 in the same way, so illustration is omitted.

Figure 5B:
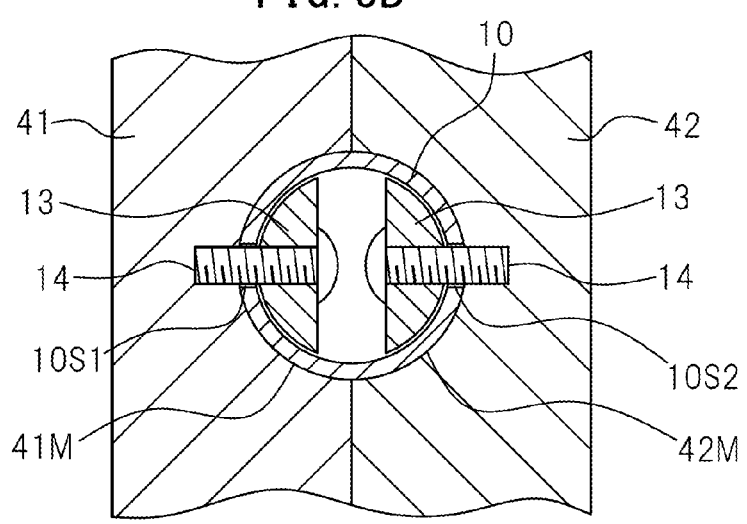
FIG. 5B is a cross-sectional view which illustrates the state where the shaft which is illustrated in FIG. 4E

FIG. 5B is a cross-sectional view which illustrates the state where the shaft 10 which is illustrated in FIG. 4E and FIG. 4F is attached by slide assist members 13 and screws 14 to the first and second housing segments 41 and 42. The first and second housing segments 41 and 42 have bosses to which the screws 14 are attached and other circuit parts, but here illustration of these is omitted. Only the positional relationship of the shaft 10, slide assist members 13, screws 14, and first and second housing segments 41 and 42 is illustrated. As will be understood from this figure and FIG. 4E and FIG. 4G, the first housing segment 41 can only move in the long direction with respect to the shaft 10, while the second housing segment 42 can move in the long direction and rotate 180 degrees with respect to the shaft 10.

Note that, the lengths of the slits 10S1 and 10S2 and the positions of the screw holes 41A and 42A inside the grooves 41M and 42M, as illustrated in FIG. 3C, should be determined so that the shafts 10 stick out into the grooves 41M and 42M by exactly the same lengths when the first and second housing segments 41 and 42 are made to fully slide. Above, the first and second housing segments 41 and 42 were explained, but the third and fourth housing segments 43 and 44, as explained above, are the same in structures as the first and second housing segments 41 and 42, so can operate the same as the first and second housing segments 41 and 42.

Figure 6A:
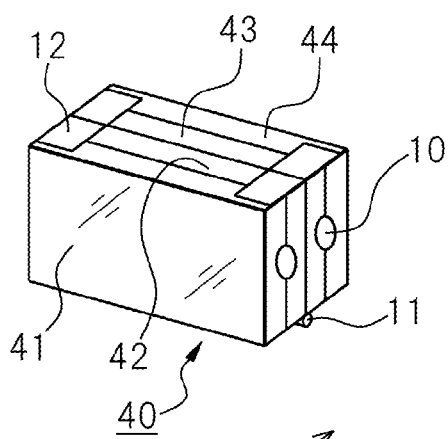
FIG. 6A is a perspective view which illustrates the initial state of a step at which the electronic device which is illustrated in FIG. 2A is changed in form to the state which is illustrated in FIG. 2B.

Here, the process by which the electronic device 40 which is provided with the first to fourth housing segments 41 to 44 which are illustrated in FIG. 2A is changed in form to the state which is illustrated in FIG. 2B will be explained using FIG. 6A to FIG. 6E and FIG. 7A to FIG. 7D. Note that, to facilitate understanding of the explanation, the shaft 10 is drawn as a simple columnar member similar to the shaft 10 which is illustrated in FIG. 3. FIG. 6A illustrates the state where the first to fourth four housing segments 41 to 44 are superposed. As explained above, the long direction side faces of the second and third housing segments 42 and 43 are joined by hinges 11, while the long direction side faces of the first and fourth housing segments 41 and 44 are joined by hinges 12.

Figure 6B:
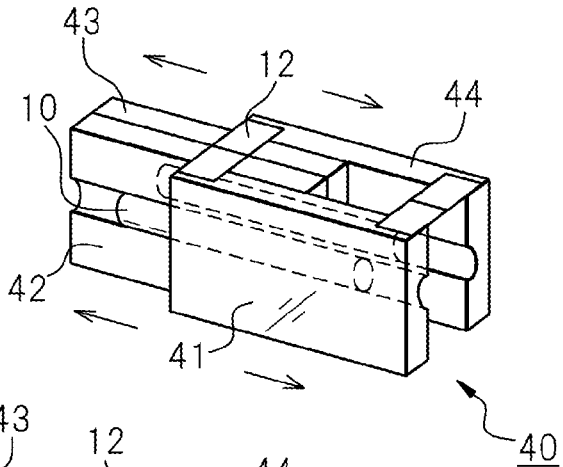
FIG. 6B is a perspective view which illustrates the state of making the outside two housing segments among the four housing segments which are illustrated in FIG. 6A slide with respect to the inside two housing segments.

FIG. 6B illustrates the state of start of making the outside first and fourth housing segments 41 and 44 among the four housing segments 41 to 44 which are illustrated in FIG. 6A slide with respect to the inside second and third housing segments 42 and 43 in the direction which is illustrated by the arrow marks. Here, the lengths of the shafts 10 which stick out from the first and fourth housing segments 41 and 44 to the second and third housing segment 42 and 43 sides and the lengths of the shafts 10 which stick out from the second and third housing segments 42 and 43 to the first and fourth housing segment 41 and 44 sides are the same.

Figure 6C:
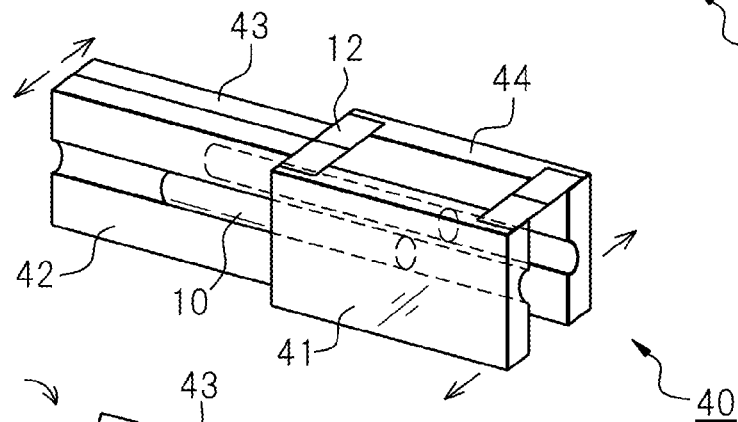
FIG. 6C is a perspective view which illustrates the state of completion of making the outside two housing segments among the four housing segments which are illustrated in FIG. 6B slide with respect to the inside two housing segments.

FIG. 6C illustrates the fully slid state of completion of making the outside first and fourth housing segments 41 and 44 which are illustrated in FIG. 6B slide with respect to the inside two second and third housing segments 42 and 43. In the fully slid state the end parts of the first and fourth housing segments 41 and 44 at the second and third housing segment 42 and 43 sides and the end parts of the second and third housing segments 42 and 43 at the first and fourth housing segment 41 and 44 sides are not superposed. Further, the lengths of the shafts 10 which stick out from the first and fourth housing segments 41 and 44 to the second and third housing segment 42 and 43 sides and the lengths of the shafts 10 which stick out from the second and third housing segments 42 and 43 to the first and fourth housing segment 41 and 44 sides are the same.

Figure 6D:
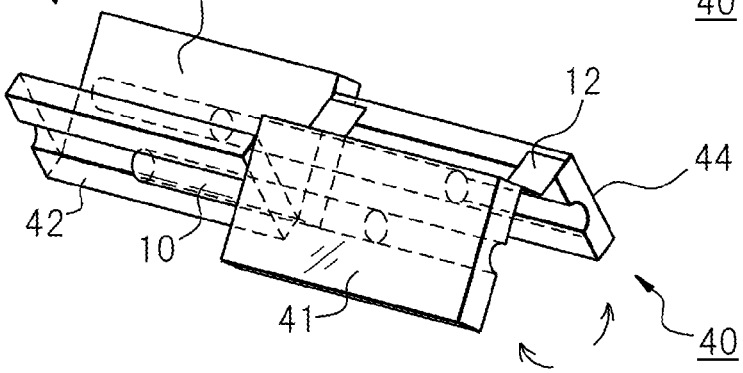
FIG. 6D is a perspective view which illustrates the state of start of making the outside two housing segments and inside two housing segments rotate about the shafts of their hinges from the state which is illustrated in FIG. 6C.
Figure 6E:
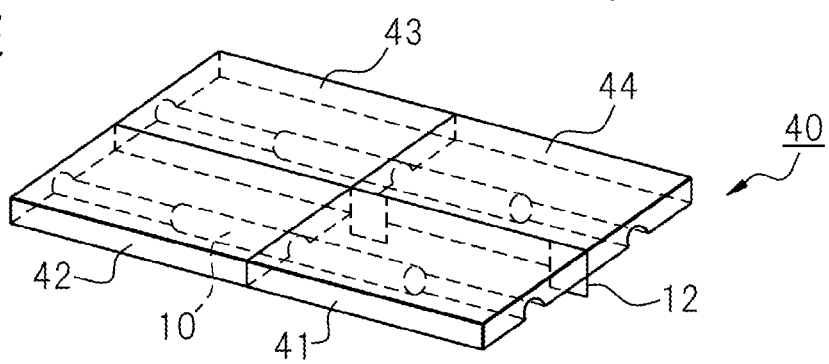
FIG. 6E is a perspective view which illustrates the state of further making the outside two housing segments and inside two housing segments rotate from the state which is illustrated in FIG. 6D to make them rotate by 180 degrees each.

From this state, the end parts of the first and fourth housing segments 41 and 44 without the hinges 12 and the end parts of the second and third housing segments 42 and 43 without the hinges 11 are spread apart in the directions of the arrow marks. This being so, the first and fourth housing segments 41 and 44 and the second and third housing segments 42 and 43, as illustrated in FIG. 6D, are made to rotate about the shafts 10 and open in V-shapes about the hinges 12 and 11. If the first and fourth housing segments 41 and 44 and the second and third housing segments 42 and 43 are further spread apart, the first and fourth housing segments 41 and 44 and the second and third housing segments 42 and 43 rotate about the shafts 10 by 180 degrees, whereby all of the surfaces become fully flat as illustrated in FIG. 6E. At the back surface sides of the fully flat first to fourth housing segments 41 to 44, the hinges 11 and 12 are exposed.

Figure 7A:
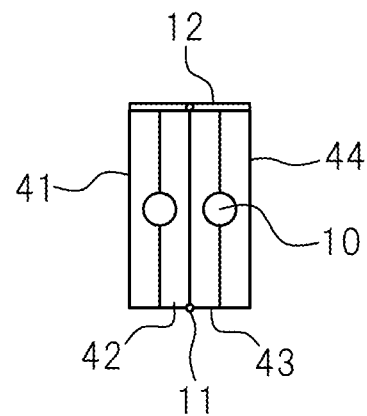
FIG. 7A is a front view of the state which is illustrated in FIG. 6A as seen from the front.
Figure 7B:
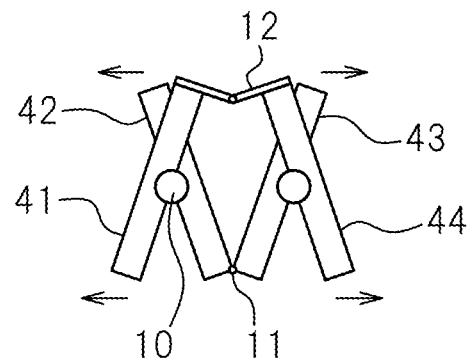
FIG. 7B is a front view which illustrates the state of start of making the outside two housing segments and inside two housing segments rotate about the shafts of their hinges from the state which is illustrated in FIG. 7A.
Figure 7C:
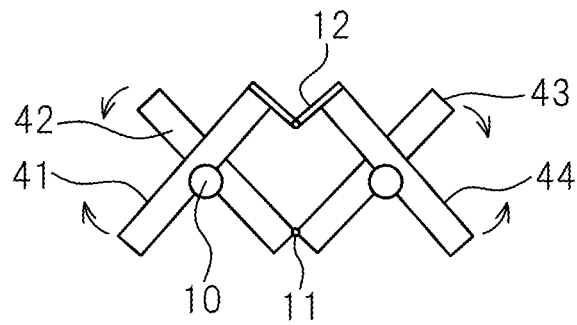
FIG. 7C is a front view which illustrates the state of further making the outside two housing segments and inside two housing segments rotate from the state which is illustrated in FIG. 7B.
Figure 7D:
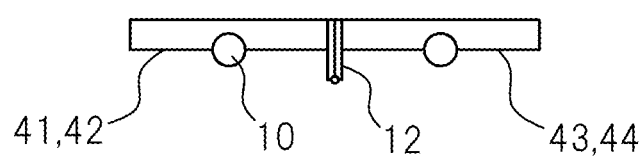
FIG. 7D is a front view which illustrates the state of further making the outside two housing segments and inside two housing segments rotate from the state which is illustrated in FIG. 7C to make them rotate by 180 degrees each and corresponds to FIG. 6E.

Views of the state which is illustrated from FIG. 6A to FIG. 6E as seen from the long direction of the electronic device 40 are illustrated from FIG. 7A to FIG. 7D. Views of the state which is illustrated from FIG. 6A to FIG. 6C as seen from the long direction of the electronic device 40 are completely the same. These are illustrated in FIG. 7A. FIG. 7B illustrates the state where the first and fourth housing segments 41 and 44 and the second and third housing segments 42 and 43 are spread apart slightly from the state which is illustrated in FIG. 6C. It is learned that if the first and fourth housing segments 41 and 44 and the second and third housing segments 42 and 43 are spread apart, the first to fourth housing segments 41 to 44 all rotate about the shafts 10. Further, FIG. 7C illustrates the state where the first and fourth housing segments 41 and 44 and the second and third housing segments 42 and 43 are further spread apart from the state which is illustrated is FIG. 6D. FIG. 7D illustrates the state which is illustrated in FIG. 6E as seen from the long direction of the electronic device 40. From FIG. 7D, it is learned that surface display of the first to fourth housing segments 41 to 44 after finishing being rotated becomes fully flat.

Figure 8A:
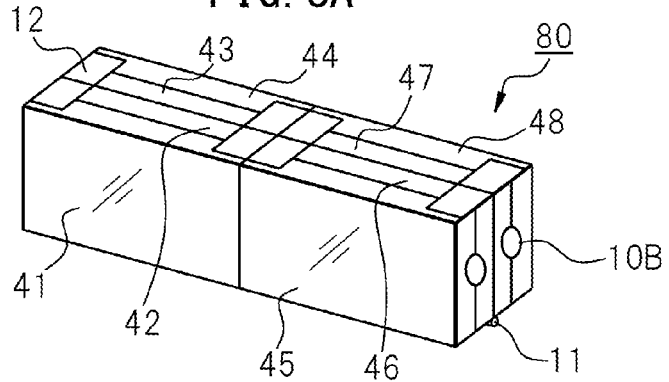
FIG. 8A is a perspective view of an electronic device which is provided with eight housing segments which is formed by joining electronic devices which are provided with four housing segments which are illustrated in FIG. 6A at end faces of sides of the housing segments which are not pulled out.

The above explained electronic device 40 used the first to fourth four housing segments 41 to 44 to form a flat four-segment screen. On the other hand, FIG. 8A illustrates an electronic device 80 which is formed by using two electronic devices 40 and joining the end faces of the outer housing segments at the sides where the inner housing segments are not pulled out. The electronic device 80 is provided with first to eighth housing segments 41 to 48. The first to fourth housing segments 41 to 44 are provided with structures similar to the electronic device 40. Further, the fifth to eighth housing segments 45 to 48 are provided with the structures of the first to fourth housing segments 41 to 44 rotated 180 degrees about the long direction of the electronic device 40.

That is, the fifth housing segment 45 is structured the same as the fourth housing segment 44, the sixth housing segment 46 is structured the same as the third housing segment 43, the seventh housing segment 47 is structured the same as the second housing segment 42, and the eighth housing segment 48 is structured the same as the first housing segment 41. Further, the end face of the first housing segment 41 at the fifth housing segment 45 side and end face of the fifth housing segment 45 at the first housing segment 41 side and the end face of the fourth housing segment 44 at the eighth housing segment 48 side and end face of the eighth housing segment 48 at the fourth housing segment 44 side are joined.

Figure 8B:
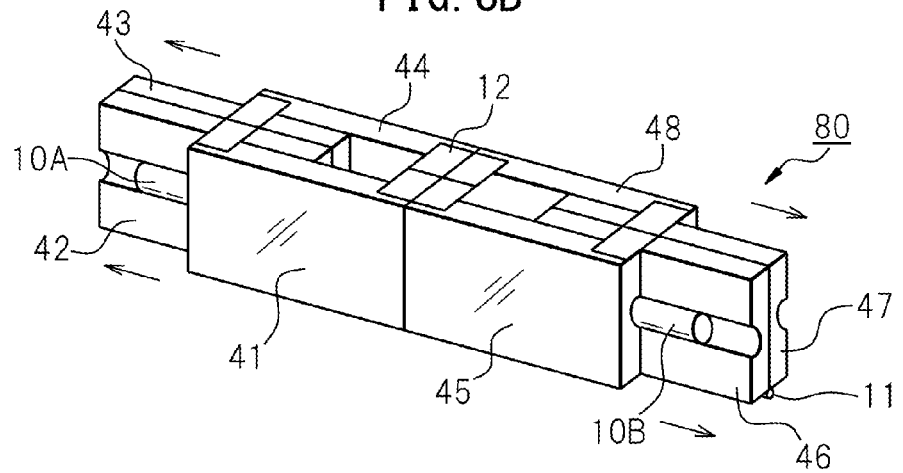
FIG. 8B is a perspective view which illustrates the state of start of making the outside two housing segments among each four housing segments which are illustrated in FIG. 8A slide with respect to the inside two housing segments in the opposite directions and corresponds to FIG. 6B.
Figure 8C:
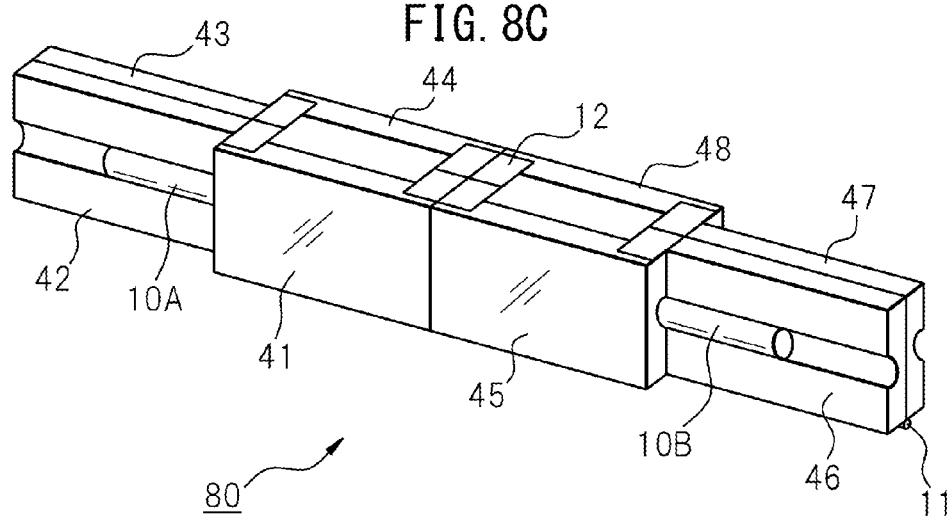
FIG. 8C is a perspective view which illustrates the state of completion of making the outside two housing segments among each four housing segments which are illustrated in FIG. 8B slide with respect to the inside two housing segments and corresponds to FIG. 6C.

In the above such configured electronic device 80, as illustrated in FIG. 8B, when the second and third housing segments 42 and 43 are pulled out in one direction from the first and fourth housing segments 41 and 44, the sixth and seventh housing segments 46 and 47 are pulled out from the fifth and eighth housing segments and 48 in the other direction. FIG. 8C illustrates the state where the second and third housing segments 42 and 43 fully slide from the first and fourth housing segments 41 and 44 and the sixth and seventh housing segments 46 and 47 fully slide from the fifth and eighth housing segments 45 and 48. FIG. 8C illustrates an electronic device 80 which corresponds to the electronic device 40 which is illustrated in FIG. 6C.

Figure 9A:
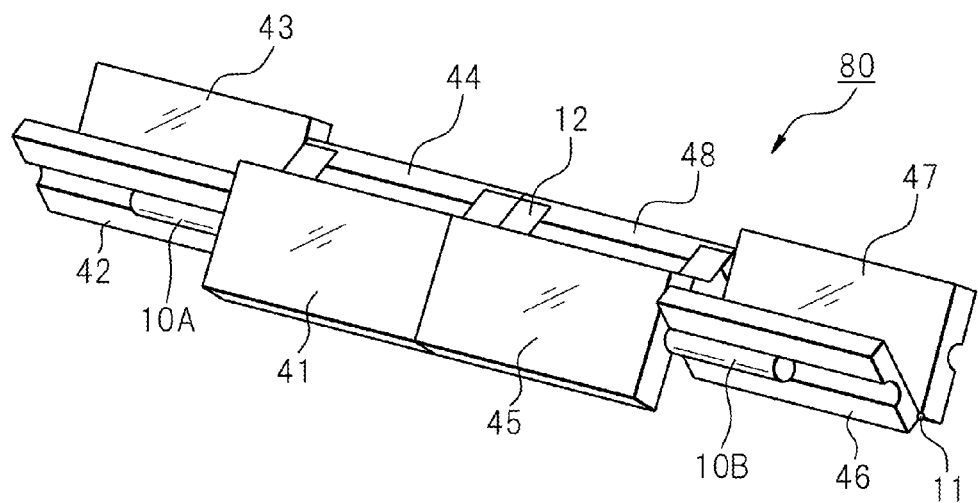
FIG. 9A is a perspective view which illustrates the state of start of making each outside two housing segments and each inside two housing segments rotate about the shafts of their hinges from the state which is illustrated in FIG. 8C and corresponds to FIG. 6D.

FIG. 9A illustrates the state of rotation of the second and third housing segments 42 and 43, first and fourth housing segments 41 and 44, fifth and eighth housing segments 45 and 48, and sixth and seventh housing segments 46 and 47 about the shafts of the corresponding hinges 11 and 12 from the state which is illustrated in FIG. 8C. The first housing segment and fifth housing segment 41 and 45 and the fourth housing segment and eighth housing segment 44 and 48 are joined at their end parts, so move as single pieces.

Figure 9B:
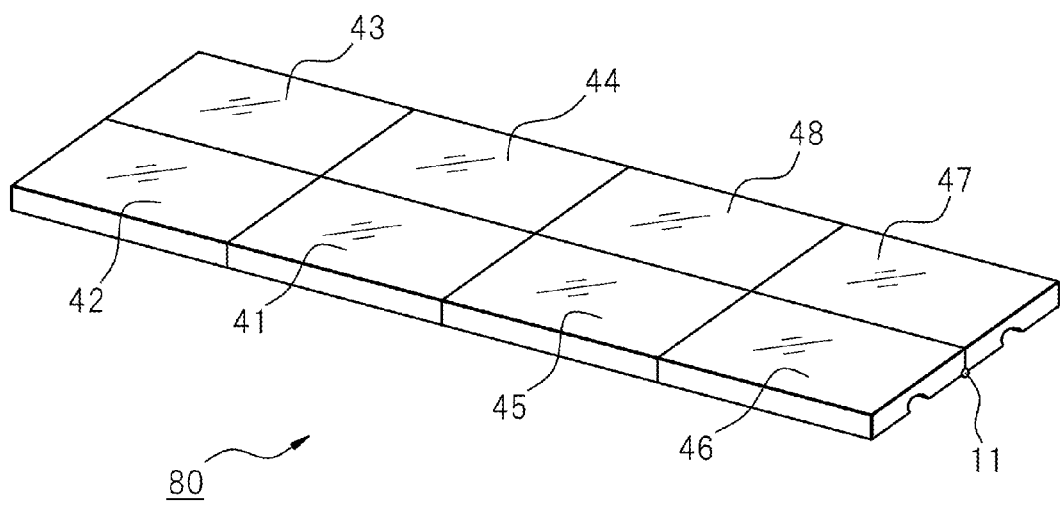
FIG. 9B is a perspective view which illustrates the state of further making each outside two housing segments and each inside two housing segments rotate from the state which is illustrated in FIG. 9A to make them rotate by 180 degrees each and corresponds to FIG. 6E.

FIG. 9B illustrates the state where the second and third housing segments 42 and 43, first and fourth housing segments 41 and 44, fifth and eighth housing segments 45 and 48, and sixth and seventh housing segments 46 and 47 are rotated from the state which is illustrated in FIG. 9A by 180 degrees. If the second and third housing segments 42 and 43, the first and fourth housing segments 41 and 44, the fifth and eighth housing segments 45 and 48, and the sixth and seventh housing segments 46 and 47 are rotated by 180 degrees, an eight-segment full flat screen is formed.

As explained above, in the disclosed electronic devices 40 and 80, the superposed plurality of housing segments can be spread apart by the joining structure to form a large flat screen, so the electronic device can be made small when carried and can be used to form a large screen at the time of image display. Further, in the embodiment which is illustrated from FIG. 8A to FIG. 8C and FIG. 9A and FIG. 9B, two electronic devices 40 are joined as they are, so the display screen which is illustrated in FIG. 9B becomes a horizontally long one, but if changing the aspect ratios of the housing segments, it is possible to realize a screen with an aspect ratio of 4:3 or 16:9.

Next, a joining structure of another embodiment where when opening a plurality of housing segments from the superposed closed state and when closing them from the open state, an assist force is applied in the opening direction and closing direction right before they finish being opened and right before they are completely closed, and an electronic device which is provided with this joining structure will be explained. Here, an electronic device which is provided with four housing segments which are provided with slide assist mechanisms will be explained. As explained above, since two each of the four housing segments are completely the same in structures, the first and second housing segments and the slide assist mechanism which is attached to these will be explained.

Figure 10:
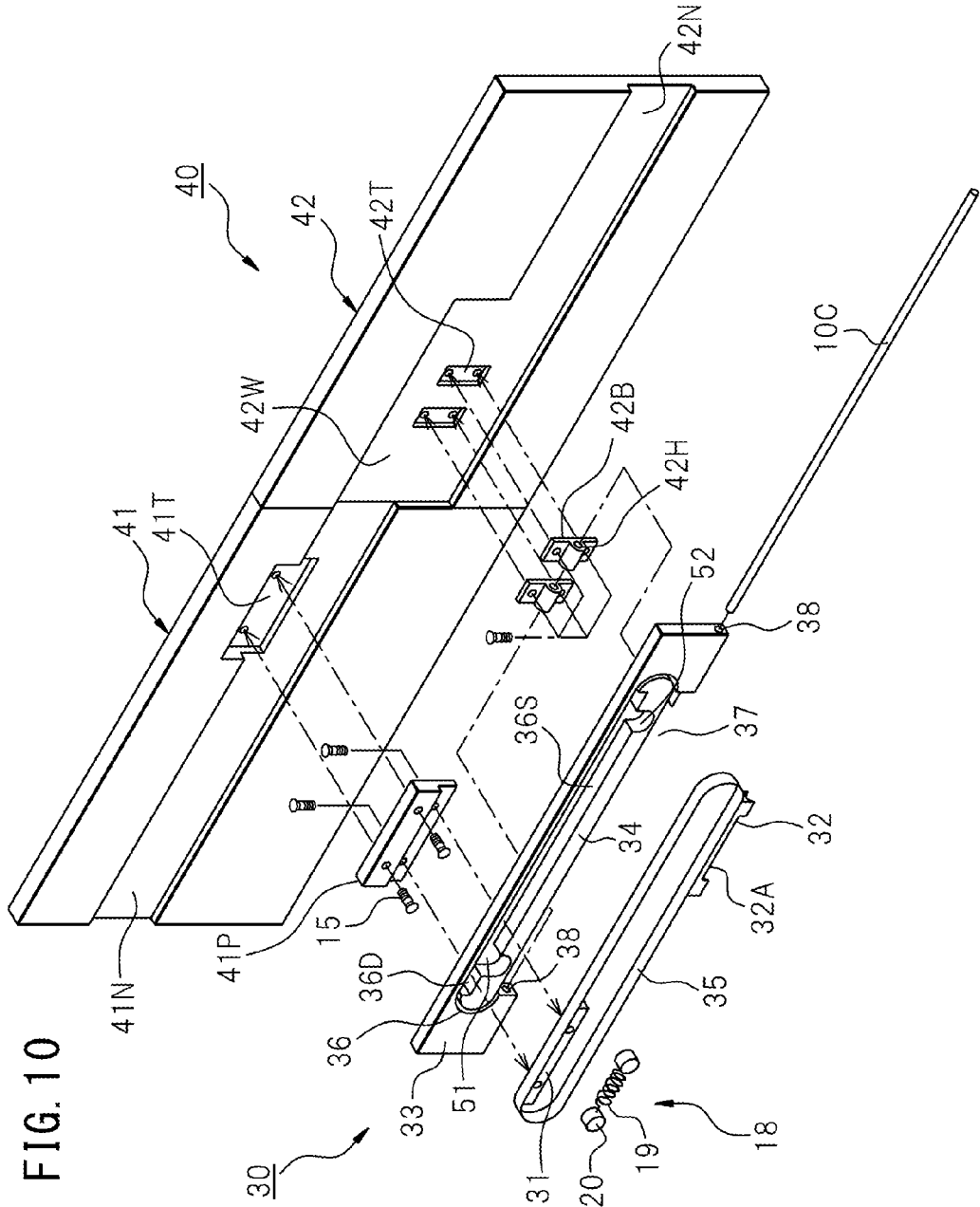
FIG. 10 is an assembled perspective view which illustrates the partial structure of a joining structure of a multi-segment housing which is provided with slide assist mechanisms of another embodiment.

FIG. 10 is an assembled perspective view which illustrates the partial structure of a joining structure of a multi-segment housing which is provided with the slide assist mechanisms 30. FIG. 10 illustrates a slide assist mechanism 30 which is attached to the first and second housing segments 41 and 42 in the electronic device 40. The first and second housing segments 41 and 42 are illustrated in the open state. This corresponds to the state of FIG. 3D of the above-mentioned embodiment as seen from the back surface side. Further, the shaft 10C which is illustrated in FIG. 10 for example corresponds to the shaft 10C which is illustrated in FIG. 3C. At the superposed surface side of the first housing segment 41, there is a groove 41N which is the same width and same depth and extends in the long direction. In the middle of the groove 41N, a rectangular cross-section mounting recessed part 41T is provided for mounting a later explained mounting plate 41P.

The second housing segment 42 is provided with a wide width groove 42W and a narrow width groove 42N of the same depth which continue in succession. The wide width groove 42W has a depth the same as the groove 41N at the first housing segment 41. One wall surface of the wide width groove 42W continues in succession with one wall surface of the groove 41N at the first housing segment 41. Further, the narrow width groove 42 is provided so as to overlap the groove 41N when the second housing segment 42 is rotated about the shaft 10C by 180 degrees and superposed over the first housing segment 41. Further, in the wide width groove 42W, rectangular cross-section mounting recessed parts 42T are provided for mounting two brackets 42B at two locations.

The slide assist mechanism 30 is provided with a main body 33, ring-shaped part 35, mounting plate 41P, two brackets 42B, and a shaft 10C. The main body 33 forms a rectangular plate shape. The length of the main body 33 is the same as the length of the first and second housing segments 41 and 42, while the width of the main body 33 is a width enabling it to slide in the groove 41N at the first housing segment 41. The length of the shaft 10C is the same as the length of the main body 33. Further, the thickness of the main body 33 is a thickness enabling it to slide in the space which is formed by the grooves 41N and 42N when the first and second housing segments 41 and 42 are superposed, that is, a thickness of about two times the depth of the groove 41N. Note that, in actuality, there is a cover at the surface of the main body 33 which faces the grooves 41N and 42N, but illustration of this cover is omitted.

At the main body 33, there is an elliptical recessed part 36 and a space which is communicated with this recessed part 36 and which is cut out to one long side part of the main body 33 to thereby form a cutaway part 37. In the recessed part 36, there is a guide member 34. The two end parts of the guide member 34 are semicircular. Between the two end parts of the recessed part 36, a semicircular passage is formed. At the guide member 34 at the opposite side to the cutaway part 37, a slit 36S provided with step differences 36D at the two ends is formed. At the parts of the slits 36S adjoining the step differences 36D, there are engagement recessed parts 51 and 52 which house and engage with the later explained endpiece members.

The ring-shaped part 35 is a belt-shaped member. At its inner circumferential surface, a first slide member 31 is attached, while at its outer circumferential surface, a second slide member 32 is attached. The lengths of the first and second slide members 31 and 32 are the same. Further, the length of the ring-shaped part 35 from one end part of the first slide member 31 to one end part of the second slide member 32 and the length of the ring-shaped part 35 from the other end part of the first slide member 31 to the other end part of the second slide member 32 are the same. The ring-shaped part 35 is assembled into the recessed part 36 of the main body 33 in the state with the two end parts inserted into the above-mentioned semicircular passage. In this state, the first slide member 31 can move in the slit 36S of the guide member 34. Further, in the state where the ring-shaped part 35 is assembled inside the recessed part 36, the second slide member 32 can move in the cutaway part 37.

At the first slide member 31 at the first housing segment 41 side, the mounting plate 41P is attached by screws 15. The mounting plate 41P to which the first slide member 31 is attached is fastened by the screws 15 to the first housing segment 41 at the mounting recessed part 41T. The second slide member 32 is provided with a recessed part 32A, so in the state with the two brackets 42B positioned in the recessed part 32A, the shaft 10C is inserted from the shaft insertion hole 38 which is provided in the main body 33 and the shaft 10C is passed through the holes 42H which are provided in the brackets 42B. The shaft 10C which is passed through the holes 42H which are provided at the brackets 42B is passed through the cutaway part 37, then is inserted in the shaft insertion hole 38 which is provided at the opposite side of the main body 33. The brackets 42B through which the shaft 10C is passed can be positioned at the two end parts of the recessed part 32A and in that state fastened by screws 15 to the mounting recessed parts 42T which are provided at the second housing segment 42.

The ring-shaped part 35, in this embodiment, is a belt-shaped member, but it may also be a wire member which uses a wire etc. The ring-shaped part 35 can be integrally produced by cutting out the parts of the first and second slide members 31 and 32 from a plastic sheet. Further, the first and second slide members 31 and 32 and the ring-shaped part 35 may also be produced as separate members and then the ring-shaped part 35 may be connected to the first and second slide members 31 and 32.

In the state where the main body 33 of the slide assist mechanism 30 is attached to the inside of the groove 41N of the first housing segment 41 and the broad width groove 42W of the second housing segment 42, one end part of the first slide member 31 is positioned at the inside of the step difference 36D at the first housing segment 41 side of the slit 36S. In this state, the assist spring member 18 which is provided with the tension spring 19 and the endpiece members 20 are attached to the inside of the slit 36S. At this time, one of the endpiece members 20 is inserted into the engagement recessed part 51, the tension spring 19 is inserted into the slit 36S between the first slide member 31 and the guide member 34, and the other of the endpiece members 20 is made a state engaged with the end part of the first slide member 31. This state is the state which is illustrated in FIG. 11A.

Figure 13A:
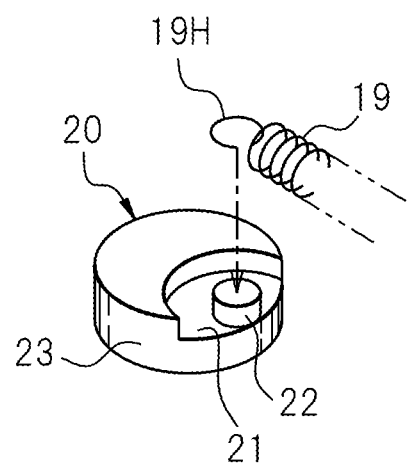
FIG. 13A is an assembled perspective view which illustrates the joining of a spring and endpiece member of a slide assist mechanism which is used for a joining structure of another embodiment.
Figure 13B:
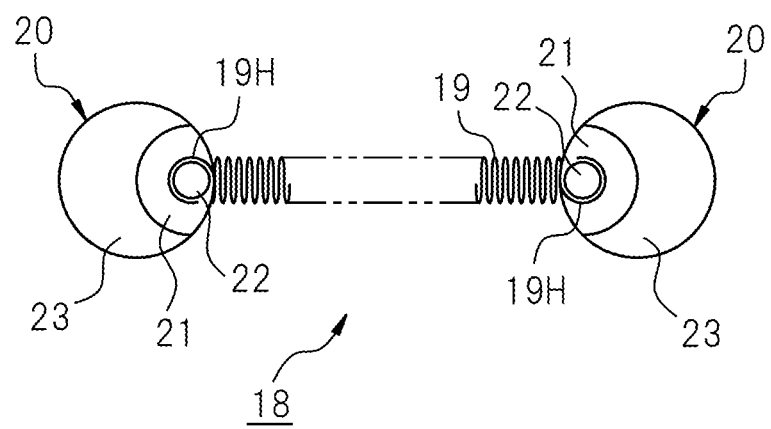
FIG. 13B is a side view which illustrates a joined state of a spring and endpiece members of a slide assist mechanism which is used for a joining structure of another embodiment.

The assist spring member 18, as illustrated in FIG. 13A and FIG. 13B, is provided with an elastic member constituted by a tension spring 19 and endpiece members 20 which are attached to the two end parts of this tension spring 19 in a swivelable manner. The endpiece members 20 have diameters larger than the width of the tension spring 19 in the short direction. Each endpiece member 20, as illustrated in, for example, FIG. 13A, is comprised of a disk-shaped main body 23 with part which is cut out in an arc shape to form a cutaway part 21 and with a post 22 which is provided sticking out near the outer circumferential part of the main body 23 of the cutaway part 21. At this post 22, a hook part 19H of the tension spring 19 is attached.

FIG. 13B illustrates the tension spring 19 which is illustrated in FIG. 13A and endpiece members 20 which are attached to the two end parts of the same. The hook parts 19H of the tension spring 19 are just hooked at the posts 22 of the endpiece members 20 so as to not detach, so the endpiece members 20 can swivel with respect to the tension spring 19. In this way, the endpiece members 20 have catch parts (posts 22) which can engage with the hook parts 19H of the spring 19. Further, the endpiece members 20, as explained later, may be disk shapes etc. so as to roll well when the parts which engage with the endpiece members 20 are changed.

As illustrated in FIG. 11A, in the state where a slide assist mechanism 30 is attached to the first and second housing segments 41 and 42, the second housing segment 42 can be made to rotate with respect to the first housing segment 41 by the shaft 10C and brackets 42B by 180 degrees. FIG. 11B illustrates the state where the second housing segment 42 is made to rotate with respect to the first housing segment 41 by the shaft 10C and the brackets 42B by 180 degrees. The state which is illustrated in FIG. 11B corresponds to the state of FIG. 3C in the above-mentioned embodiment. If the second housing segment 42 rotates with respect to the first housing segment 41 by 180 degrees, the groove 41N of the first housing segment 41 and the groove 42N of the second housing segment 42 are connected in a straight line.

Therefore, in this state, if external force is applied to the two end parts of the first housing segment 41 and second housing segment 42, the slide assist mechanism 30 slides in the groove 41N of the first housing segment 41 and the groove 42N of the second housing segment 42, so it is possible to make the first housing segment 41 and the second housing segment 42 approach. In the state which is illustrated in FIG. 11B, if external force starts to be applied to the two end parts of the first housing segment 41 and second housing segment 42, one endpiece member 20 of the assist spring member 18 is engaged with the engagement recessed part 51, while the other endpiece member 20 is engaged with one end part of the first slide member 31. Therefore, due to movement of the first housing segment 41 in a direction approaching the second housing segment 42, the tension spring 19 extends. Furthermore, if the first housing segment 41 approaches the second housing segment 42, the other end part of the first slide member 31 passes the position of the engagement recessed part 51.

If the other end part of the first slide member 31 passes the position of the engagement recessed part 51, the endpiece member 20 sticks out from the engagement recessed part 51 and is engaged with the other end part of the first slide member 31. FIG. 12A illustrates the state where the first housing segment 41 and the second housing segment 42 approach each other by exactly the length of half of the total length from the state of FIG. 11B. This corresponds to the state of FIG. 3B of the above-mentioned embodiment.

FIG. 12A illustrates the operation of the slide assist mechanism 30, so illustration of the second housing segment 42 is omitted. Just this position is illustrated by a two-dot broken line. The assist spring member 18, in the state with the endpiece members 20 at the two end parts engaged with the two end parts of the first slide member 31, makes the first housing segment 41 and the second housing segment 42 approach each other. In the state with the endpiece members 20 engaged with the two end parts of the first slide member 31, the tension spring 19 is extended and the endpiece members 20 are subjected to a tensile force in directions making then approach the other endpiece members 20.

If the first housing segment 41 and the second housing segment 42 further approach and one end part of the first slide member 31 reaches the position of the engagement recessed part 52, an endpiece member 20 of the assist spring member 18 enters the engagement recessed part 52. If endpiece member 20 of the assist spring member 18 enters the engagement recessed part 52, the assist spring member 18 with one endpiece member 20 engaged by the engagement recessed part 52 tenses the endpiece member 20 which is engaged with the other end part of the first slide member 31 by the tension spring 19. For this reason, right before the first and second housing segments 41 and 42 are superposed, an assist force in a direction making the first and second housing segments 41 and 42 approach is generated by the tension spring 19 and the first and second housing segments 41 and 42 are easily superposed. FIG. 12B illustrates the state where the first and second housing segments 41 and 42 are superposed. This corresponds to the state which is illustrated in FIG. 3A of the above-mentioned embodiment.

Conversely, when the closed state first and second housing segments 41 and 42 are opened up, the operation from the state which is illustrated in FIG. 12A to the state which is illustrated in FIG. 11B is performed by the slide assist mechanism 30. In this case, right before the first and second housing segments 41 and 42 fully slide, an assist force in a direction making the first and second housing segments 41 and 42 separate is generated by the tension spring 19 and the force at the time when the first and second housing segments 41 and 42 become the fully slid state is reduced.

Figure 14A:
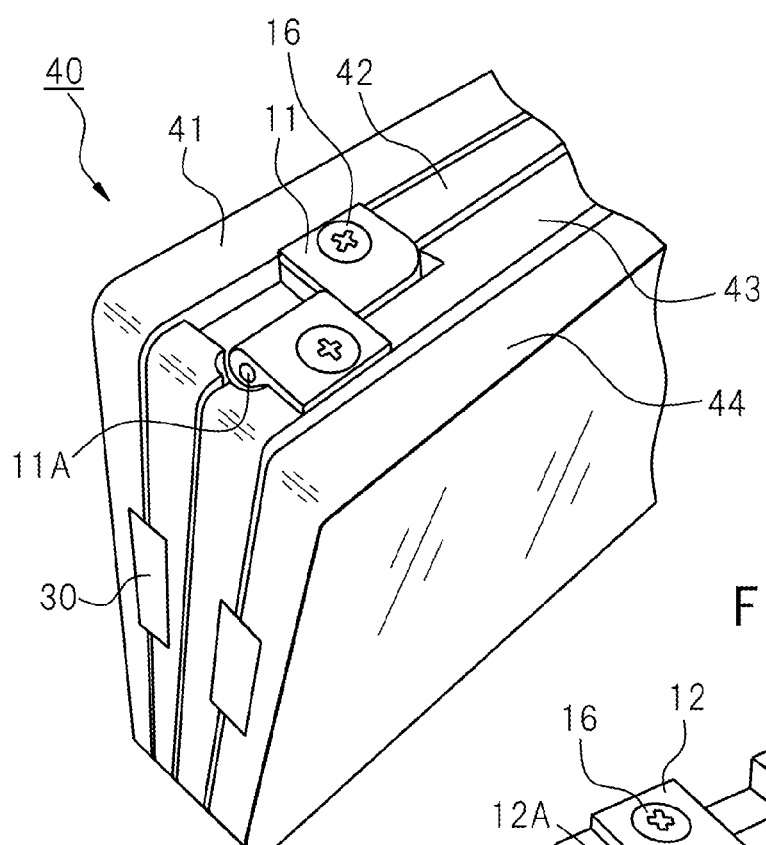
FIG. 14A is a partial perspective view which illustrates a hinge which joins the second housing segment and third housing segment in the joining structure of another embodiment.

FIG. 14A illustrates a hinge 11 which joins the second housing segment 42 and third housing segment 43 in an electronic device 40 which is provided with a joining structure of another embodiment. One end of the hinge 11 is fixed by a screw 16 to an end part of the second housing segment 42, while the other end of the hinge 11 is fixed by a screw 16 to one end part of the third housing segment. The second housing segment 42 and the third housing segment 43 can rotate about a shaft 11A of the hinge 11.

Figure 14B:
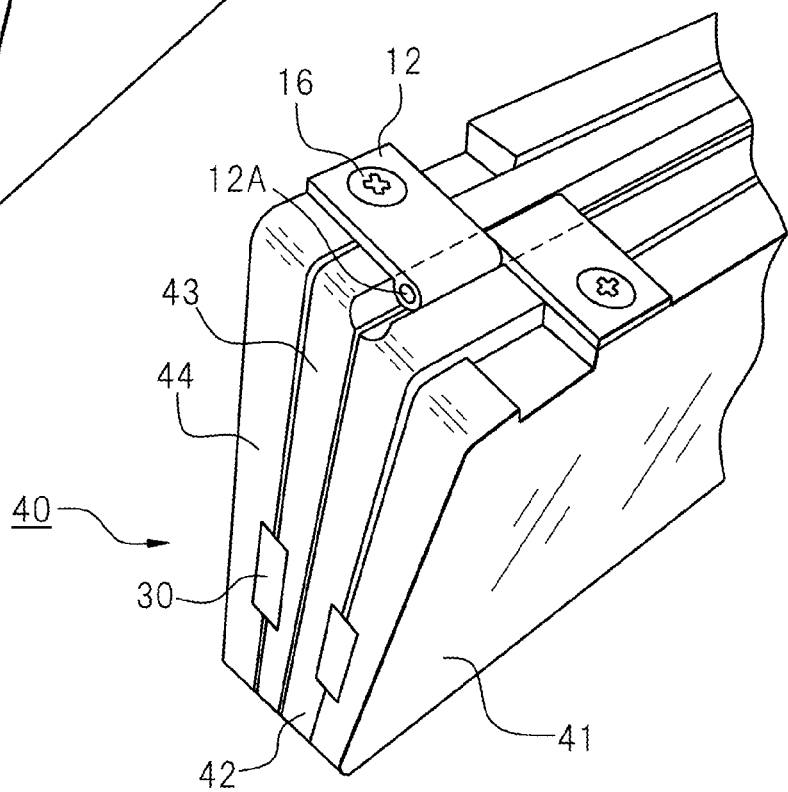
FIG. 14B is a partial perspective view which illustrates a hinge which joins the first housing segment and fourth housing segment in the joining structure of another embodiment.

FIG. 14B illustrates a hinge 12 which joins the first housing segment 41 and fourth housing segment 44 in an electronic device 40 which is provided with a joining structure of another embodiment. One end of the hinge 12 is fixed by a screw 16 to an end part of the first housing segment 41, while the other end of the hinge 12 is fixed by a screw 16 to an end part of the fourth housing segment. The first housing segment 41 and the fourth housing segment 44 can rotate about a shaft 12A of the hinge 12.

As explained above, the electronic devices 40 and 80 which are provided with the joining structure of a multi-segment housing of the present application can form full flat large screens in the state with the plurality of housing segments provided with screens joined together and can be made shapes convenient for carrying by superposing the housing segments by a rotating and sliding operation.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A joining structure of a multi-segment housing characterized by being provided with
shafts which are arranged between first and second housing segments and third and fourth housing segments when aligning first to fourth four housing segments in that order and each of which makes aligned housing segments slide, then makes one rotate 180 degrees with respect to the other,
a first hinge which joins single end faces of said second and third housing segments which are exposed in directions parallel with said shaft, and
a second hinge which joins end faces of said first and fourth housing segments which are exposed in directions parallel with said shaft at opposite sides to the end faces of said first hinge sides,
said shafts being used to make said second and third housing segments slide with respect to said first and fourth housing segments and, in the finished slid state, said first and second hinges being used to make said second and third housing segments and said first and fourth housing segments rotate about said shafts and open to form a single flat surface.

2. The joining structure of a multi-segment housing according to claim 1, wherein
said shafts are provided with lengths the same as the total lengths of said four housing segments in the slide direction, and
said shafts are attached between the first and second housing segments and the third and fourth housing segments so that the length of said shaft which is exposed at said first and fourth housing segment sides and the length of said shaft which is exposed at said second and third housing segment sides become the same when said shafts are used to make said second and third housing segments slide with respect to said first and fourth housing segments.

3. The joining structure of a multi-segment housing according to claim 1, wherein
each shaft is formed from a hollow cylindrical member,
one side face is formed with a first slit which is parallel with an axial direction of said shaft, a side face at an opposite side to the side face where said first slit is provided is formed with a second slit which is parallel with an axial direction of said shaft, one end part of said second slit is connected to a third slit which circles said shaft in a direction vertical to an axial direction of said shaft, an end part of said third slit is provided on an extension of said first slit, and each said shaft is attached by screws which pass through said first and second slits to screw holes which are provided in the housing segments at the two sides of said shaft.

4. The joining structure of a multi-segment housing according to claim 2, wherein each shaft is formed from a hollow cylindrical member, one side face is formed with a first slit which is parallel with an axial direction of said shaft, a side face at an opposite side to the side face where said first slit is provided is formed with a second slit which is parallel with an axial direction of said shaft, one end part of said second slit is connected to a third slit which circles said shaft in a direction vertical to an axial direction of said shaft, an end part of said third slit is provided on an extension of said first slit, and each said shaft is attached by screws which pass through said first and second slits to screw holes which are provided in the housing segments at the two sides of said shaft.

5. The joining structure of a multi-segment housing according to claim 3, wherein between a screw head of each screw and an inner circumferential surface of each shaft, a slide assist member is attached.

6. The joining structure of a multi-segment housing according to claim 4, wherein between a screw head of each screw and an inner circumferential surface of each shaft, a slide assist member is attached.

7. The joining structure of a multi-segment housing according to claim 3, wherein the lengths of said first and second slits and positions of the screw holes at said housing segments are lengths and positions where said shafts stick out by exactly the same lengths at the housing segments at the two sides when two facing housing segments are fully slid.

8. The joining structure of a multi-segment housing according to claim 4, wherein the lengths of said first and second slits and positions of the screw holes at said housing segments are lengths and positions where said shafts stick out by exactly the same lengths at the housing segments at the two sides when two facing housing segments are fully slid.

9. The joining structure of a multi-segment housing according to claim 5, wherein the lengths of said first and second slits and positions of the screw holes at said housing segments are lengths and positions where said shafts stick out by exactly the same lengths at the housing segments at the two sides when two facing housing segments are fully slid.

10. The joining structure of a multi-segment housing according to claim 6, wherein the lengths of said first and second slits and positions of the screw holes at said housing segments are lengths and positions where said shafts stick out by exactly the same lengths at the housing segments at the two sides when two facing housing segments are fully slid.

11. The joining structure of a multi-segment housing according to claim 1, wherein said shafts have built into them slide assist mechanisms which assist the forces in the slide directions right before said second and third housing segments finish sliding in directions closing and directions opening with respect to said first and fourth housing segments.

12. The joining structure of a multi-segment housing according to claim 11, wherein said slide assist mechanisms are provided with fixed mechanisms which are fixed at the housing segment side and moving mechanisms which move with respect to the housing segment, said fixed mechanisms are provided with grooves which are provided between said first and second housing segments and between said third and fourth housing segments, mounting plates which attach said moving mechanisms to said first and third housing segments, and brackets which hold shafts which are provided at said moving mechanisms to be able to slide with respect to said second and fourth housing segments, said moving mechanisms are provided with main bodies which move in said grooves in a state between the state where the housing segments are superposed and the state where they are fully slid, recessed parts which are provided in said main bodies in long directions, ring-shaped parts which are inserted in said recessed parts and move along the inner circumferential surfaces of the same, first slide members of predetermined lengths which are provided at the inner circumference sides at positions which bisect the total lengths of said ring-shaped parts, second slide members which are provided at the outer circumference side and which are provided with total lengths the same as said first slide members, guide members which are provided at the insides of said ring-shaped parts of said recessed parts and which are provided with guide surfaces which face paths of movement of said first slide members across predetermined distances, spacers which are provided at the outsides of said recessed parts and which enable movement of said second slide members, recessed parts which are provided at the two sides of said guide surfaces and which face said first slide members when said first slide members are positioned the left end sides in said recessed parts and when they are positioned at the right end sides, and assist spring members which have columnar elastic members which can expand and contract and endpiece members which are connected to the two end parts of said elastic members to be able to swivel and which have horizontal widths larger than the horizontal widths of said elastic members, which have one of said endpiece members engaged with one of said recessed parts when said first slide members are positioned at left end sides in said recessed parts and when they are positioned at right end sides, and which are arranged in said recessed parts so that said elastic members are housed in spaces between said first slide members and said guide surfaces and so that the other endpiece members are engaged with end parts of said first slide members, inside the spaces, said shafts are provided with their two end parts supported at said main bodies, mounting plates of said fixed mechanisms are fixed to said first slide members, and said brackets hold said shafts to slide inside said spaces and are engaged with said second slide members so that the positional relationships with said second slide members do not change.

13. The joining structure of a multi-segment housing according to claim 12, wherein
said grooves are provided with first grooves which are provided at said first and third housing segments and second and third grooves which are provided at said second and fourth housing segments,
said first grooves are provided with widths for holding said moving mechanisms and with center axes which are offset from the center axes of said housing segments in long directions of said housing segments, and
said second and third grooves are provided at the left and right of lines bisecting said second and fourth housing segments in the long directions, in the state where said first and second housing segments and said third and fourth housing segments are superposed, said second grooves being superposed over said first grooves, while in the state where said second and fourth housing segments are rotated 180 degrees with respect to the housing segments of said first and third housing segments, said third grooves receiving said moving mechanisms.

14. The joining structure of a multi-segment housing according to claim 13, wherein
said elastic members are tension springs, and, when said first slide members move and said first slide members leave the facing positions of the two end parts of said first slide members, said endpiece members which had been engaged with one of said recessed parts detach from said recessed parts and said two endpiece members are engaged with the two end parts of said first slide members, and,
when said first slide members move and the end parts of said first slide members at the front end side in the moving direction reach the end part positions of said recessed parts, said endpiece members which were engaged with the end parts at the front end sides are engaged while entering said recessed parts, while tensile forces in the moving direction are applied to the back end sides of said first slide members from said assist spring members.

15. The joining structure of a multi-segment housing according to claim 12, wherein said recessed parts are shaped as ellipses, the outer circumferential surfaces of said guide members which are positioned at the two end parts of said recessed parts and face the two end parts of said recessed parts are circumferential surfaces, and movement passages through which said ring-shaped parts can move are formed between the two end parts of said recessed parts and said outer circumferential surfaces of said guide members.

16. The joining structure of a multi-segment housing according to claim 13, wherein said recessed parts are shaped as ellipses, the outer circumferential surfaces of said guide members which are positioned at the two end parts of said recessed parts and face the two end parts of said recessed parts are circumferential surfaces, and movement passages through which said ring-shaped parts can move are formed between the two end parts of said recessed parts and said outer circumferential surfaces of said guide members.

17. The joining structure of a multi-segment housing according to claim 14, wherein said recessed parts are shaped as ellipses, the outer circumferential surfaces of said guide members which are positioned at the two end parts of said recessed parts and face the two end parts of said recessed parts are circumferential surfaces, and movement passages through which said ring-shaped parts can move are formed between the two end parts of said recessed parts and said outer circumferential surfaces of said guide members.

18. An electronic device which is provided with first to fourth four housing segments, characterized in that
a joining structure of a multi-segment housing which is provided with shafts which are arranged between first and second housing segments and third and fourth housing segments when superposing said first to fourth four housing segments in that order and each of which makes superposed housing segments slide, then makes one rotate 180 degrees with respect to the other, a first hinge which joins single end faces of said second and third housing segments which are exposed in directions parallel with said shaft, and a second hinge which joins end faces of said first and fourth housing segments which are exposed in directions parallel with said shaft at opposite sides to the end faces of said first hinge sides and
a control device which is provided at each of said first to fourth housing segments and which displays an image of a screen of one-fourth of a single displayed image synchronized with the other screens are provided,
said shafts of said joining structure of the multi-segment housing being used to make said second and third housing segments slide with respect to said first and fourth housing segments and, in the slid end state, said first and second hinges being used to make said second and third housing segments and said first and fourth housing segments rotate about said shafts and open to form a single flat surface by said first to fourth housing segments, and
said control device being used to display a single image as a whole on adjoining display screens when said single flat surface is formed.

19. An electronic device which is provided with a joining structure of a multi-segment housing characterized in that
two of the electronic devices according to claim 18 are provided,
among the end faces of said first and fourth housing segments in the long direction, the end faces at the opposite sides to the sides where said second and third housing segments extend and retract are joined,
each of the eight housing segments is provided with a control device for displaying an image of a screen of one-eighth of one displayed image synchronized with the other screens, and
when two of the first to fourth housing segments are used to form a single flat surface, the adjoining display screens display a single image as a whole.

* * * * *